United States Patent
Shen et al.

(10) Patent No.: US 10,472,232 B2
(45) Date of Patent: Nov. 12, 2019

(54) MEMS DEVICE INTEGRATED WITH A SEMICONDUCTOR INTEGRATED CIRCUIT AND MANUFACTURING METHOD THEREOF

(71) Applicant: UNITED MICROELECTRONICS CORP., Hsin-Chu (TW)

(72) Inventors: Tsong-Lin Shen, Kaohsiung (TW);
Chien-Chung Su, Kaohsiung (TW);
Chih-Cheng Wang, New Taipei (TW);
Yu-Chih Chuang, Tainan (TW);
Sheng-Wei Hung, Taipei (TW);
Min-Hung Wang, Taichung (TW);
Chin-Tsai Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 83 days.

(21) Appl. No.: 15/373,489

(22) Filed: Dec. 9, 2016

(65) Prior Publication Data
US 2018/0162725 A1    Jun. 14, 2018

(51) Int. Cl.
*B81C 1/00*     (2006.01)
*B81B 7/02*     (2006.01)
*H04R 19/04*    (2006.01)
*H04R 19/00*    (2006.01)
*H04R 7/16*     (2006.01)
*H04R 31/00*    (2006.01)

(52) U.S. Cl.
CPC ............ *B81C 1/00246* (2013.01); *B81B 7/02* (2013.01); *H04R 7/16* (2013.01); *H04R 19/005* (2013.01); *H04R 19/04* (2013.01); *H04R 31/00* (2013.01); *B81B 2201/0257* (2013.01); *B81B 2201/0264* (2013.01); *B81B 2203/0127* (2013.01); *B81B 2203/0315* (2013.01); *B81B 2207/015* (2013.01); *B81B 2207/056* (2013.01); *B81B 2207/098* (2013.01); *B81C 2201/0107* (2013.01); *B81C 2201/0133* (2013.01); *B81C 2203/0714* (2013.01); *B81C 2203/0735* (2013.01); *B81C 2203/0771* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 8,310,065 B2 * | 11/2012 | Wu | B81C 1/00246 257/773 |
| 8,330,239 B2 | 12/2012 | Tang | |
| 9,630,837 B1 * | 4/2017 | Chu | B81B 3/0021 |
| 2006/0244138 A1 * | 11/2006 | Beaulieu | H01L 21/76886 257/736 |
| 2011/0057288 A1 * | 3/2011 | Tan | B81B 3/0072 257/503 |

(Continued)

OTHER PUBLICATIONS https://www.dictionary.com/browse/cover?s=ts; 2018.*

*Primary Examiner* — Nilufa Rahim
(74) *Attorney, Agent, or Firm* — Winston Hsu

(57) ABSTRACT

A semiconductor device includes a semiconductor substrate comprising a MOS transistor. A MEMS device is integrally constructed above the MOS transistor. The MEMS device includes a bottom electrode in a second topmost metal layer, a diaphragm in a pad metal layer, and a cavity between the bottom electrode and the diaphragm.

11 Claims, 7 Drawing Sheets

(56) References Cited

U.S. PATENT DOCUMENTS

2014/0239352 A1* 8/2014 Wang .................... H04R 19/04
    257/254
2016/0332865 A1* 11/2016 Chen .................... B81B 3/0054

* cited by examiner

MEMS DEVICE INTEGRATED WITH A SEMICONDUCTOR INTEGRATED CIRCUIT AND MANUFACTURING METHOD THEREOF

BACKGROUND OF THE INVENTION

1. Field of the Invention

The present invention relates generally to the field of semiconductor technology. More particular, the present invention relates to a semiconductor device with integrated MEMS (Micro-Electro-Mechanical Systems) structures, and a method for fabricating the same.

2. Description of the Prior Art

Micro-Electro-Mechanical Systems, or MEMS, is a technology that in its most general form can be defined as miniaturized mechanical and electro-mechanical elements (i.e., devices and structures) that are made using the techniques of microfabrication.

As known in the art, poly silicon is typically used as a mechanical layer in fabricating MEMS devices because of its mechanical, electrical, and thermal properties. However, the fabrication techniques used for polysilicon-based MEMS devices are complex and are not compatible with the complementary metal-oxide semiconductor (CMOS) processes.

There is an unmet need in this industry for integrating MEMS devices with a semiconductor integrated circuit die, and a method for fabricating the MEMS device that is fully compatible with CMOS processes.

SUMMARY OF THE INVENTION

According to one aspect of the invention, a semiconductor device includes a semiconductor substrate comprising a MOS transistor. A MEMS device is integrally constructed above the MOS transistor. The MEMS device includes a bottom electrode in a second topmost metal layer, a diaphragm in a pad metal layer, and a cavity between the bottom electrode and the diaphragm. The MEMS device may be a microphone or a pressure sensor.

According to another aspect of the invention, a semiconductor device includes a semiconductor substrate having a plurality of metal layers thereon. A first MEMS device is integrally constructed in the plurality of metal layers on the semiconductor substrate. The first MEMS device has a first cavity. A second MEMS device is integrally constructed in the plurality of metal layers on the semiconductor substrate. The second MEMS device has a second cavity. A volume of the second cavity is greater than that of the first cavity.

According to still another aspect of the invention, a method for fabricating a semiconductor device is disclosed. A semiconductor substrate comprising a MOS transistor is provided. A MEMS device is formed over the MOS transistor. The MEMS device includes a bottom electrode in a second topmost metal layer, a diaphragm in a pad metal layer, and a cavity between the bottom electrode and the diaphragm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
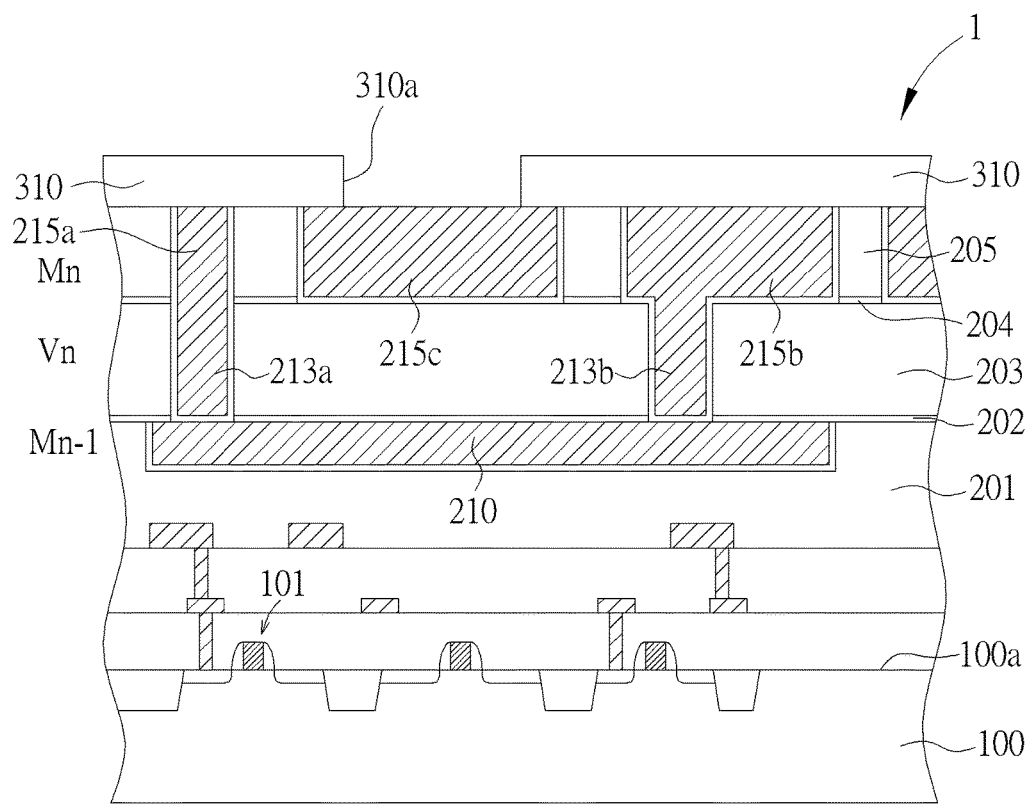
FIG. 1 to FIG. 6 are schematic, cross-sectional diagrams showing a method for fabricating a semiconductor device with MEMS structures integrally constructed in the topmost metal layer, the second topmost metal layer, and the pad metal layer according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

The terms wafer and substrate used herein include any structure having an exposed surface onto which a material layer is deposited, for example, to form a circuit structure including, but not limited to, an interconnection metal line or a redistribution layer (RDL). The term substrate is understood to include semiconductor wafers, but not limited thereto. The term substrate is also used to refer to semiconductor structures during processing, and may include other layers that have been fabricated thereupon.

The present disclosure pertains to integrated CMOS/MEMS die having a MEMS device that is integrally constructed in the topmost metal layer, a second topmost metal layer, and a pad metal layer on a semiconductor substrate. The MEMS device may be fabricated with CMOS compatible processes and may be directly over an active circuit such as a MOS transistor or a CMOS circuit region.

Throughout the specification and drawings, the symbol "$M_n$" refers to the topmost level of the metal layers below an aluminum redistribution layer (RDL), fabricated in the integrated circuit chip, while "$M_{n-1}$" refers to the second topmost metal layer that is one level lower than the topmost metal layer and so on, wherein, preferably, n ranges between 2 and 10 ($n=_{2-10}$), but not limited thereto. The symbol "V" refers to the via plug connecting two adjacent levels of the metal layers. For example, $V_6$ refers to the via plug interconnecting $M_6$ to $M_5$.

Figure 6:
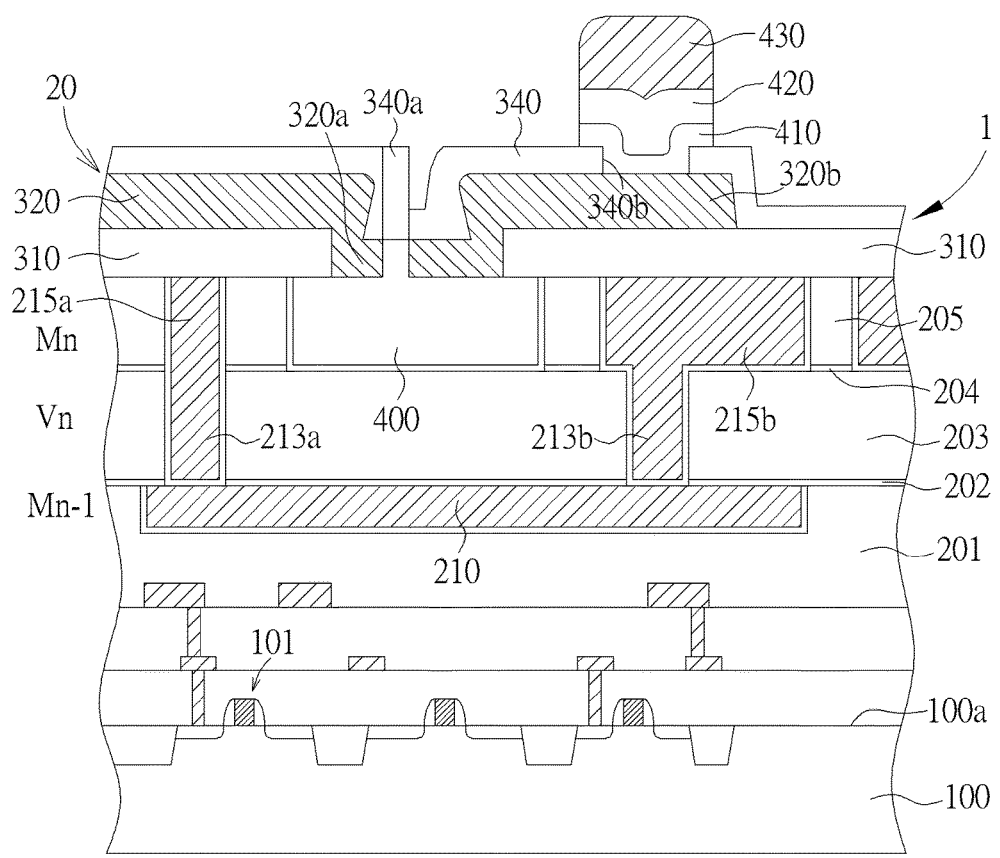
Figure 7:
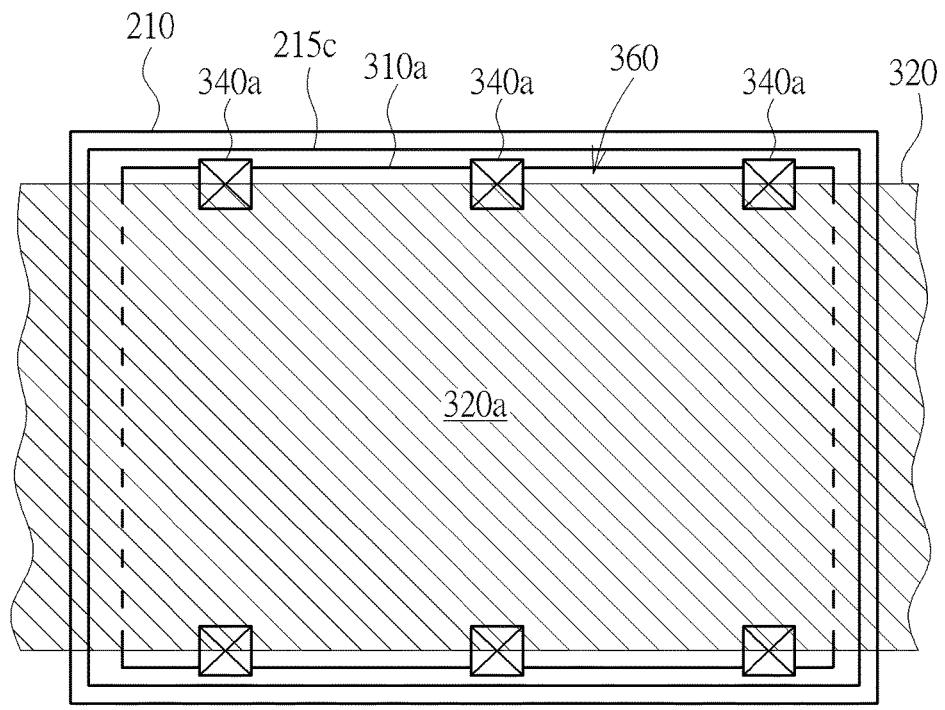
FIG. 7 is an exemplary layout diagram showing the arrangement of the bottom electrode, the diaphragm, and via opening for forming the cavity between the bottom electrode and the diaphragm.

Please refer to FIG. 1 to FIG. 7. FIG. 1 to FIG. 6 are schematic, cross-sectional diagrams showing a method for fabricating a semiconductor device 1 with MEMS structures integrally constructed in the topmost metal layer, the second topmost metal layer, and the pad metal layer according to one embodiment of the invention. FIG. 7 is an exemplary layout diagram showing the arrangement of the bottom electrode, the diaphragm, and via opening for forming the cavity between the bottom electrode and the diaphragm.

As shown in FIG. 1, a semiconductor substrate 100 is provided. The semiconductor substrate 100 may comprise single crystalline silicon, SiGe, or epitaxial silicon, but is not limited thereto. At least a metal-oxide-semiconductor (MOS) transistor 101 is fabricated on a major surface 100a of the semiconductor substrate 100. A plurality of dielectric layers including inter-metal dielectric (IMD) layers 201, 203, and 205 are formed on the semiconductor substrate 100. A plurality of metal layers may be fabricated in the plurality of dielectric layers.

For example, a topmost metal layer $M_n$ may be fabricated in the IMD layer 205, a second topmost metal layer $M_{n-1}$ may be fabricated in the IMD layer 201, and a via layer $V_n$ may be fabricated in the IMD layer 203. According to one embodiment, the topmost metal layer $M_n$, the second topmost metal layer $M_{n-1}$, and the via layer $V_n$ may be copper damascene structures.

The aforesaid dielectric layers on the semiconductor substrate 100 may comprise silicon oxide, silicon nitride, silicon oxy-nitride, ultra-low k dielectric, or any suitable dielectric materials known in the art. For example, the IMD layers 201, 203, 205 may comprise fluorosilicate glass (FSG). A silicon nitride cap layer 202 may be formed between the IMD layer 201 and the IMD layer 203. A silicon oxy-nitride stop layer 204 may be formed between the IMD layer 203 and the IMD layer 205.

It is understood that the dielectric stack shown in the figures are for illustration purposes only. Other dielectric structures or materials may be employed without departing from the scope of the present invention.

According to one embodiment, a bottom electrode 210 is fabricated in the second topmost metal layer $M_{n-1}$. According to one embodiment, optionally, the bottom electrode 210 may be connected to a first via 213a and a second via 213b. The first via 213a and second via 213b may be fabricated in the IMD layer 203. According to one embodiment, optionally, the first via 213a and second via 213b may be further connected to a first metal pattern 215a and a second metal pattern 215b, respectively. The first metal pattern 215a and the second metal pattern 215b may be fabricated in the IMD layer 205.

According to one embodiment, a sacrificial metal pattern 215c is fabricated in the topmost metal layer $M_n$ and embedded in the IMD layer 205 between the first metal pattern 215a and the second metal pattern 215b. According to one embodiment, the sacrificial metal pattern 215c may be surrounded by the first metal pattern 215a and the second metal pattern 215b and may be spaced apart from the first metal pattern 215a and the second metal pattern 215b.

According to one embodiment, the sacrificial metal pattern 215c may be isolated from the first metal pattern 215a and the second metal pattern 215b by the IMD layer 205. In another embodiment, the sacrificial metal pattern 215c may be contiguous with the first metal pattern 215a and the second metal pattern 215b.

According to one embodiment, a dielectric layer 310 is then deposited on the IMD layer 205 and on the topmost metal layer $M_n$ including the sacrificial metal pattern 215c.

According to one embodiment, the dielectric layer 310 may comprise silicon oxide or silicon nitride, but is not limited thereto. For example, the dielectric layer 310 may comprise a TEOS (tetraethylorthosilicate) oxide layer and a silicon nitride layer on the TEOS oxide layer. Subsequently, a lithographic process and an etching process are performed to form an opening 310a in the dielectric layer 310.

According to one embodiment, the opening 310a is completely overlapped with the sacrificial metal pattern 215c when viewed from the above. According to one embodiment, the opening 310a partially exposes a top surface of the underlying sacrificial metal pattern 215c.

Figure 2:
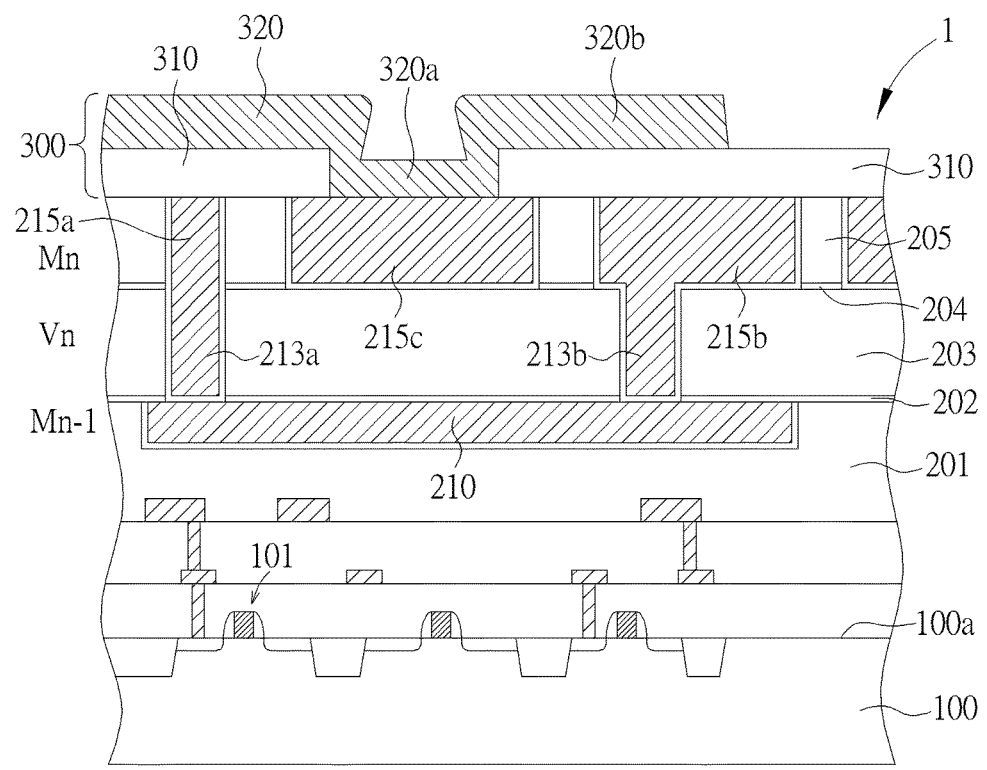

As shown in FIG. 2, after the formation of the opening 310a in the dielectric layer 310, a pad metal layer 320 is formed on the dielectric layer 310 and in the opening 310a. According to one embodiment, the pad metal layer 320 may comprise aluminum or aluminum-copper alloys, but is not limited thereto. The pad metal layer 320 may be patterned by conventional lithographic and dry etching processes.

According to one embodiment, the pad metal layer 320 may comprise a diaphragm pattern 320a situated within the opening 310a. According to one embodiment, the diaphragm pattern 320a is in direct contact with the sacrificial metal pattern 215c. According to one embodiment, the diaphragm pattern 320a does not completely fill the opening 310a. A gap (not shown in this figure) may be formed between an edge of the diaphragm pattern 320a and the dielectric layer 310.

According to one embodiment, the pad metal layer 320 may further comprise a pad pattern 320b for forming a bump pad. According to one embodiment, the pad pattern 320b is situated directly on the dielectric layer 310 and may be electrically connected to the diaphragm pattern 320a. According to one embodiment, the pad metal layer 320 and the dielectric layer 310 constitute a re-distribution layer (RDL) structure 300 over the topmost metal layer $M_n$.

Figure 3:
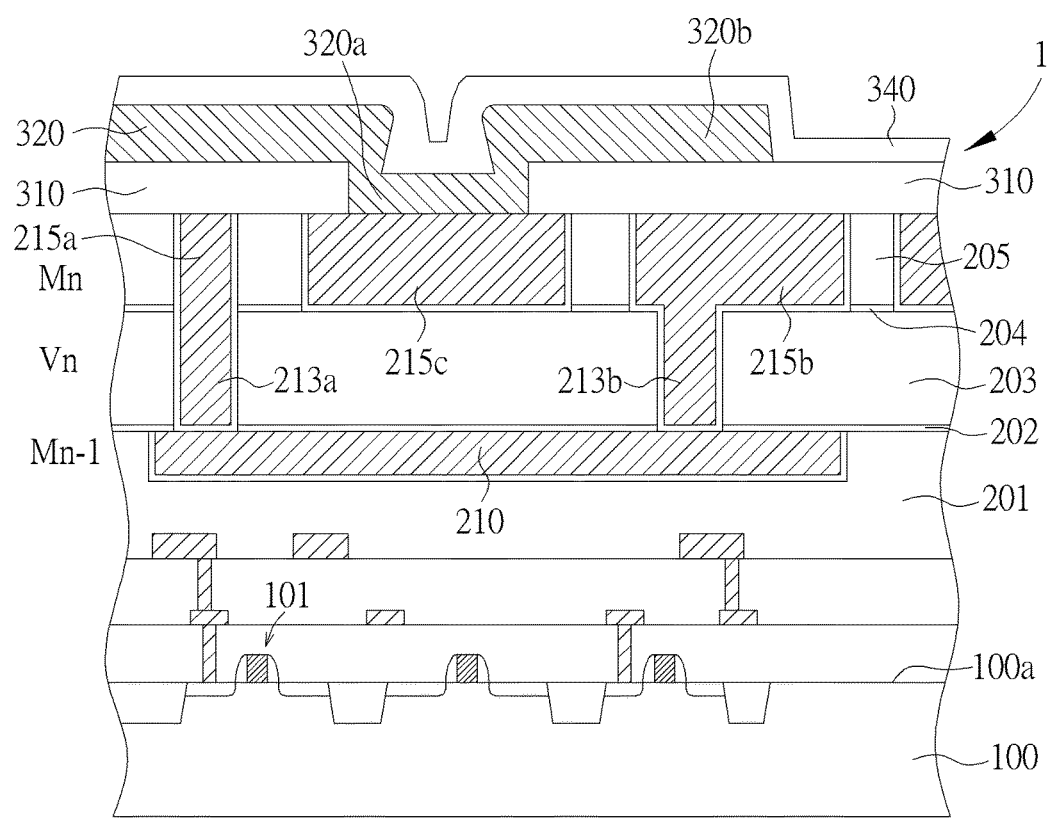

As shown in FIG. 3, after the formation of the pad metal layer 320 and the diaphragm pattern 320a in the opening 310a, a passivation layer 340 is deposited over the semiconductor substrate 100. According to one embodiment, the passivation layer 340 may comprise silicon nitride, silicon oxide, polyimide, or any suitable passivation materials known in the art. The passivation layer 340 conformally covers the dielectric layer 310 and the pad metal layer 320 including the diaphragm pattern 320a. The passivation layer 340 also fills into the gap between an edge of the diaphragm pattern 320a and the dielectric layer 310.

Figure 4:
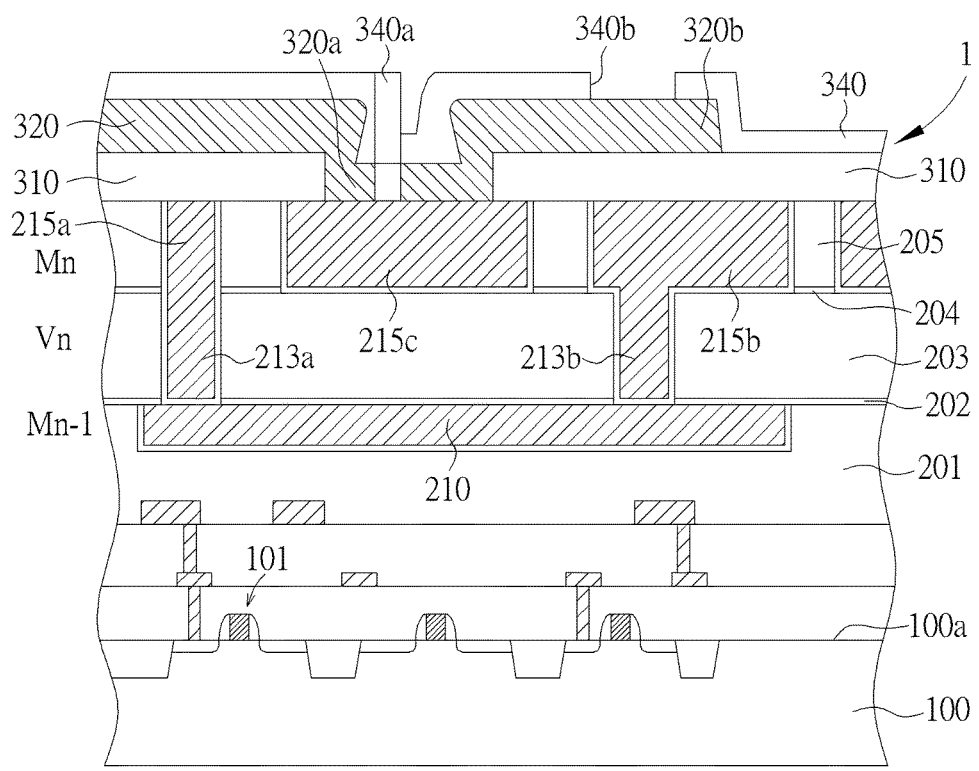
Figure 5:
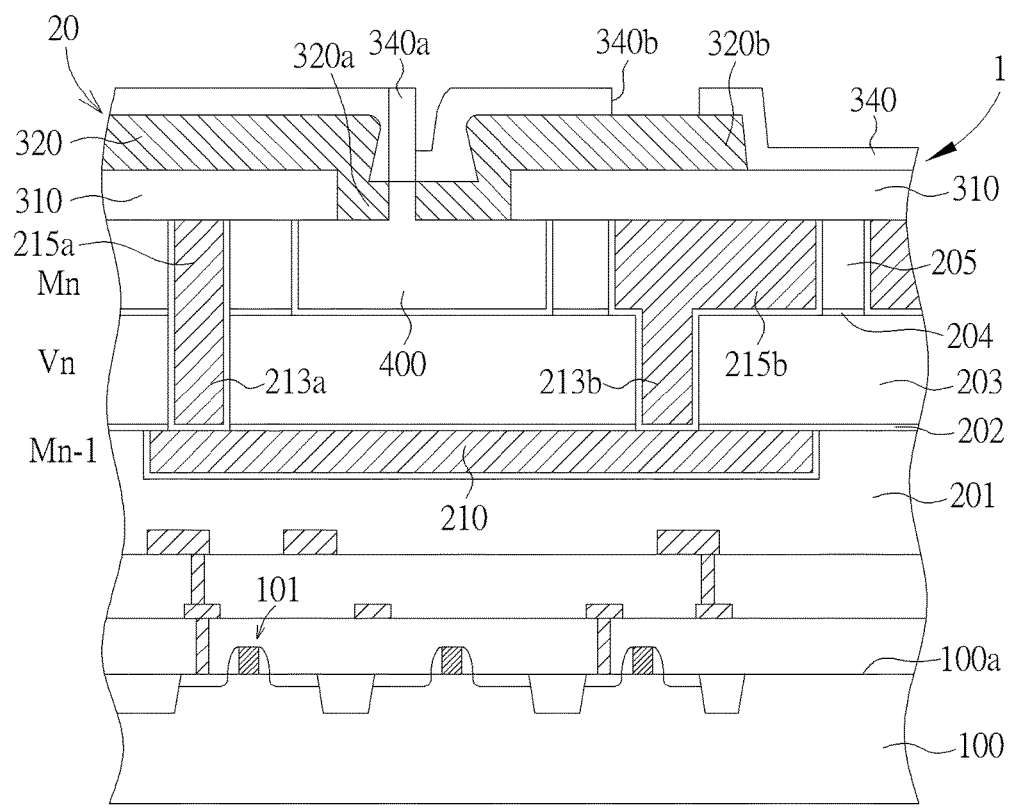

As shown in FIG. 4, a lithographic process and a dry etching process are performed to format least a via opening 340a penetrating through the passivation layer 340. According to one embodiment, the via opening 340a may be situated directly above the gap between an edge of the diaphragm pattern 320a and the dielectric layer 310. According to one embodiment, the via opening 340a may be self-aligned to the edge of the diaphragm pattern 320a and may partially expose the edge of the diaphragm pattern 320a.

Please refer briefly to FIG. 7. FIG. 7 is an exemplary layout diagram showing the arrangement of the bottom electrode 210, the sacrificial metal pattern 215c, the diaphragm 320a (pad metal layer 320), the opening 310a, and the via opening 340a. According to one embodiment, the via opening 340a may be situated directly above the gap 360 between an edge of the diaphragm pattern 320a and the dielectric layer 310. According to one embodiment, the via opening 340a may be self-aligned to the edge of the diaphragm pattern 320a and may partially expose the edge or a sidewall surface of the diaphragm pattern 320a.

According to one embodiment, a pad opening 340b may be formed in the passivation layer 340 directly above the pad pattern 320b. After the formation of the via opening 340a and the pad opening 340b, a selective wet etching process is performed to etching away the sacrificial metal pattern 215c through the via opening 340a, thereby forming a cavity 400 between the diaphragm 320a and the bottom electrode 210. For example, the selective wet etching process may involve the use of EKC solution or solvent that is able to selectively remove the copper.

According to one embodiment, the cavity 400 is capped by the diaphragm 320a, the dielectric layer 310, and the passivation layer 340. The via opening 340a communicates with the cavity 400. The diaphragm 320a, the bottom electrode 210, and the cavity 400 constitute a MEMS device 20, which may function as a microphone or a pressure sensor, but is not limited thereto.

As shown in FIG. 6, after the formation of the cavity 400, an under-bump-metallurgy (UBM) layer 410 may be formed in the pad opening 340b. The UBM layer 410 may comprise nickel, gold, titanium, or the like. Subsequently, a bump pad 420 such as a copper layer is formed on the UBM layer 410. According to one embodiment, a solder bump 430 may be formed on the bump pad 420.

Figure 8:
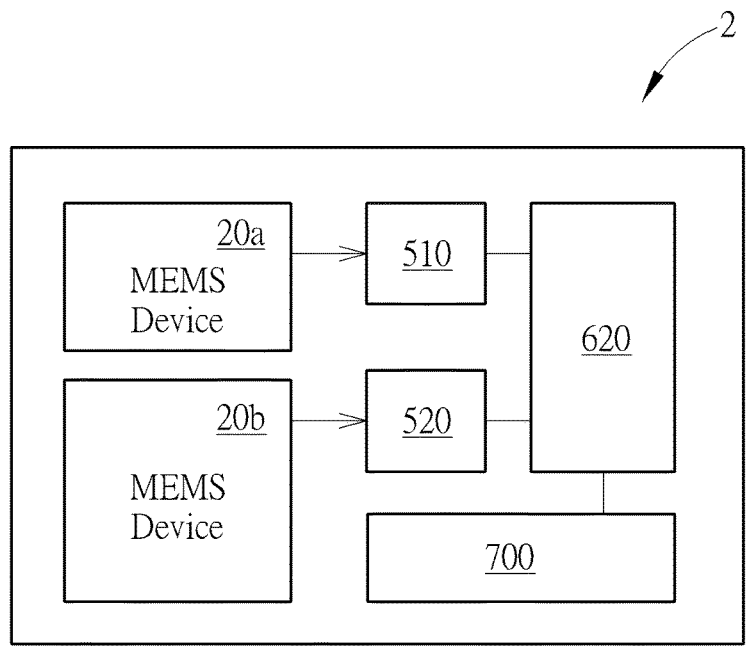
FIG. 8 is a system block diagram according to another embodiment of the invention.

Please refer to FIG. 8. FIG. 8 is a system block diagram according to another embodiment of the invention. According to the embodiment, the semiconductor device 2 has two MEMS devices 20a and 20b fabricated on a semiconductor substrate. The structure and the fabrication steps of the two MEMS devices 20a and 20b are similar to that as shown through FIG. 1 to FIG. 7. According to the embodiment, the two MEMS devices 20a and 20b are two MEMS microphones with cavities of different dimensions for decoupling noise.

As shown in FIG. 8, and briefly back to FIG. 1 to FIG. 7, likewise, the semiconductor device 2 comprises a semiconductor substrate 100 having thereon a plurality of metal layers. A first MEMS device 20a is integrally constructed in the plurality of metal layers on the semiconductor substrate 100. The first MEMS device 20a comprises a first cavity. A second MEMS device 20b is integrally constructed in the plurality of metal layers on the semiconductor substrate 100. The second MEMS device 20b comprises a second cavity. A volume of the second cavity is greater than that of the first cavity.

According to the embodiment, the second MEMS device 20b is a low-frequency microphone and the first MEMS device 20a is a high-frequency microphone. The first MEMS device 20a may be electrically coupled to a first pre-amplifier 510, and the second MEMS device 20b may be electrically coupled to a second pre-amplifier 520. The first pre-amplifier 510 and the second pre-amplifier 520 are both coupled to a mixer 620. The mixer 620 may be coupled to an Application-Specific Integrated Circuit (ASIC) 700.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a semiconductor substrate comprising a metal-oxide-semiconductor (MOS) transistor;
a Micro-Electro-Mechanical Systems (MEMS) device integrally constructed above the MOS transistor, wherein the MEMS device comprises a bottom electrode in a second topmost metal layer, a diaphragm in a pad metal layer, and a cavity between the bottom electrode and the diaphragm, wherein the diaphragm and the pad metal layer are of an integral continuous structure and made of same material composition;
a first inter-metal dielectric (IMD) layer, wherein the second topmost metal layer is embedded in the first IMD layer;
a second IMD layer on the first IMD layer;
a topmost metal layer embedded in the second IMD layer;
a third IMD layer between the first IMD layer and the second IMD layer;
a via layer embedded in the third IMD layer for electrically connecting the second topmost metal layer with the topmost metal layer;
a dielectric layer covering the topmost metal layer and the second IMD layer, wherein the pad metal layer is disposed on the dielectric layer; and
a passivation layer on the pad metal layer, wherein the passivation layer is directly above the diaphragm, and wherein a portion of the third IMD layer is disposed directly between the bottom electrode and the cavity, wherein the dielectric layer comprises an opening directly above the cavity, and wherein the bottom electrode is a continuous planar structure.

2. The semiconductor device according to claim 1, wherein the diaphragm is situated within the opening.

3. The semiconductor device according to claim 1, wherein the pad metal layer comprises AlCu alloy, and wherein the topmost metal layer and the second topmost metal layer comprise copper.

4. The semiconductor device according to claim 1 further comprising a via opening penetrating through the passivation layer, wherein the via opening communicates with the cavity.

5. The semiconductor device according to claim 4, wherein the via opening partially exposes a sidewall surface of the diaphragm, but does not penetrate through the diaphragm, wherein the via opening is disposed and confined within outer boundary of the cavity, and the via opening is extending beyond the diaphragm so as to expose a top portion thereof when viewed under a top layout view.

6. The semiconductor device according to claim 1, wherein the MEMS device comprises a microphone or a pressure sensor.

7. A semiconductor device, comprising:
a semiconductor substrate comprising a plurality of metal layers; and
a first Micro-Electro-Mechanical Systems (MEMS) device integrally constructed in the plurality of metal layers on the semiconductor substrate, wherein the first MEMS device comprising a first cavity; and
a second MEMS device integrally constructed in the plurality of metal layers on the semiconductor substrate, wherein the second MEMS device comprising a second cavity, wherein a volume of the second cavity is greater than that of the first cavity,
wherein the first MEMS device comprises a bottom electrode in a second topmost metal layer of the plurality of metal layers, a diaphragm in a pad metal layer above the plurality of metal layers, and the first cavity between the bottom electrode and the diaphragm;

wherein the diaphragm and the pad metal layer are of an integral continuous structure and made of same material composition;
a first inter-metal dielectric (IMD) layer, wherein the second topmost metal layer is embedded in the first IMD layer;
a second IMD layer on the first IMD layer;
a topmost metal layer of the plurality of metal layers embedded in the second IMD layer;
a third IMD layer between the first IMD layer and the second IMD layer;
a via layer embedded in the third IMD layer for electrically connecting the second topmost metal layer with the topmost metal layer;
a dielectric layer covering the topmost metal layer and the second IMD layer,
wherein the pad metal layer is disposed on the dielectric layer; and
a passivation layer on the pad metal layer, wherein the passivation layer is directly above the diaphragm, and wherein a portion of the third IMD layer is disposed directly between the bottom electrode and the first cavity, wherein the dielectric layer comprises an opening directly above the first cavity, and wherein the bottom electrode is a continuous planar structure.

8. The semiconductor device according to claim 7, wherein the second MEMS device is a low-frequency microphone and the first MEMS device is a high-frequency microphone.

9. The semiconductor device according to claim 8, wherein the first MEMS device is electrically coupled to a first pre-amplifier, and the second MEMS device is electrically coupled to a second pre-amplifier.

10. The semiconductor device according to claim 9, wherein the first pre-amplifier and the second pre-amplifier are both coupled to a mixer.

11. The semiconductor device according to claim 10, wherein the mixer is coupled to an Application-Specific Integrated Circuit (ASIC).

* * * * *